United States Patent
Werner et al.

[11] Patent Number: 5,939,722
[45] Date of Patent: Aug. 17, 1999

[54] SEMICONDUCTOR DETECTOR FOR INFRARED RADIATION AND METHOD FOR MANUFACTURING SAME

[75] Inventors: Wolfgang Werner; Rainer Bruchhaus, both of Munich; Wolfram Wersing, Kirchheim, all of Germany

[73] Assignee: Siemens Aktiengesellschaft, Munich, Germany

[21] Appl. No.: 08/958,582

[22] Filed: Oct. 28, 1997

[30] Foreign Application Priority Data

Oct. 31, 1996 [DE] Germany .............................. 19645036

[51] Int. Cl.6 ........................................................ G01J 5/20
[52] U.S. Cl. ...................................... 250/338.4; 250/338.1
[58] Field of Search .............................. 250/338.4, 338.1, 250/370.01; 257/684; 438/73; 216/2

[56] References Cited

U.S. PATENT DOCUMENTS

| | | |
|---|---|---|
| 3,801,949 | 4/1974 | Larrabee . |
| 5,449,910 | 9/1995 | Wood et al. .......................... 250/338.4 |
| 5,596,219 | 1/1997 | Hierold . |
| 5,760,455 | 6/1998 | Hierold et al. . |

FOREIGN PATENT DOCUMENTS

| | | |
|---|---|---|
| 195 09 868 | 9/1996 | Germany . |
| 40-6317475 | 11/1994 | Japan .................................. 250/338.4 |

OTHER PUBLICATIONS

"Thermoelectric Infrared Sensors in CMOS Technology," Lenggenhager, et al., Sensors and Actuators A, 37–38 (1993), pp. 216–220.

*Primary Examiner*—Edward P. Westin
*Assistant Examiner*—Richard Hanig
*Attorney, Agent, or Firm*—Hill & Simpson

[57] ABSTRACT

A semiconductor detector for infrared radiation is manufactured by the steps of depositing an auxiliary layer on a main surface of a carrier, depositing a membrane layer provided with at least one opening onto the auxiliary layer, selectively etching the auxiliary layer through the at least one opening of the membrane layer, so that a hollow space arises in the auxiliary layer, sealing the hollow space by depositing a covering on th membrane layer, and fashioning a detector element on the covering by depositing a material sensitive to infrared radiation within a region of the covering that is bounded by the hollow space therebelow.

23 Claims, 3 Drawing Sheets

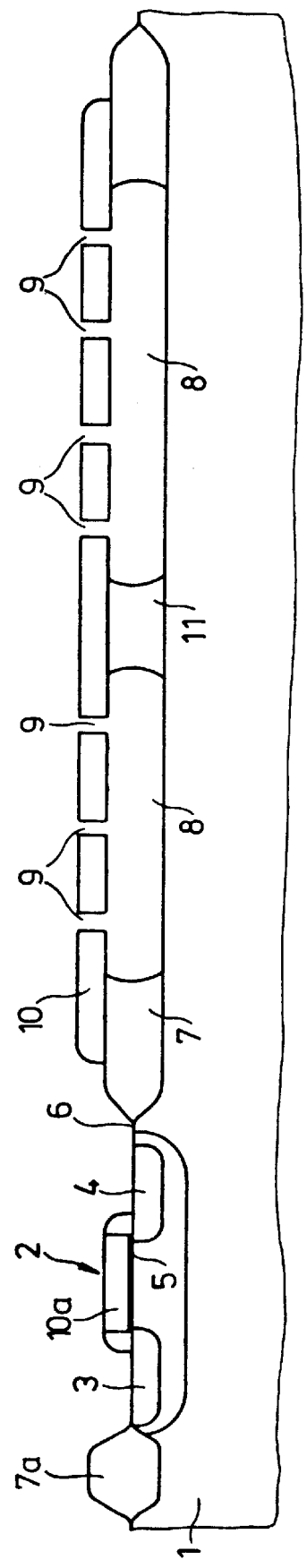
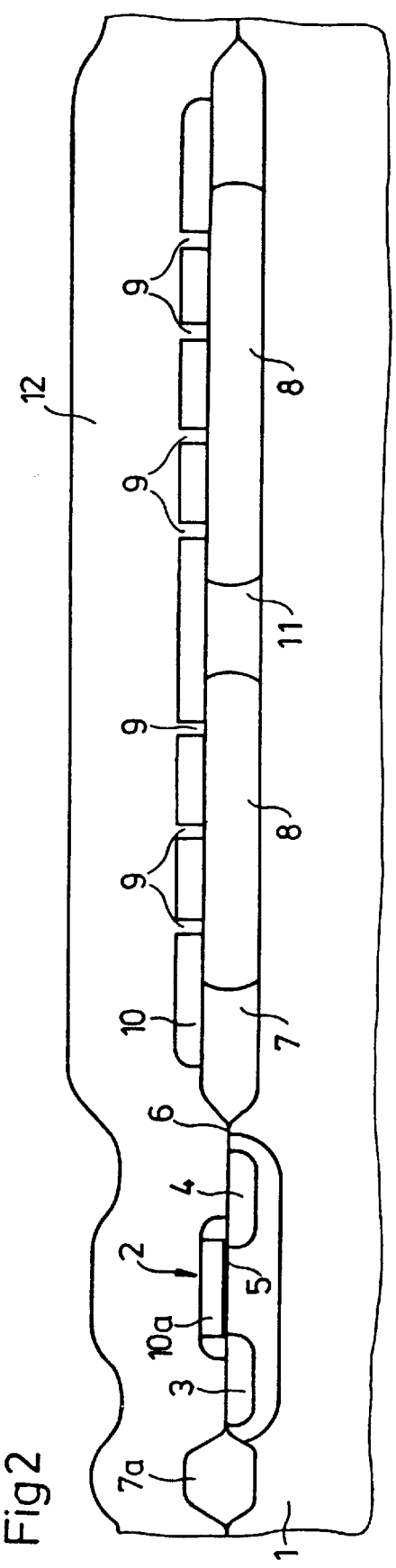

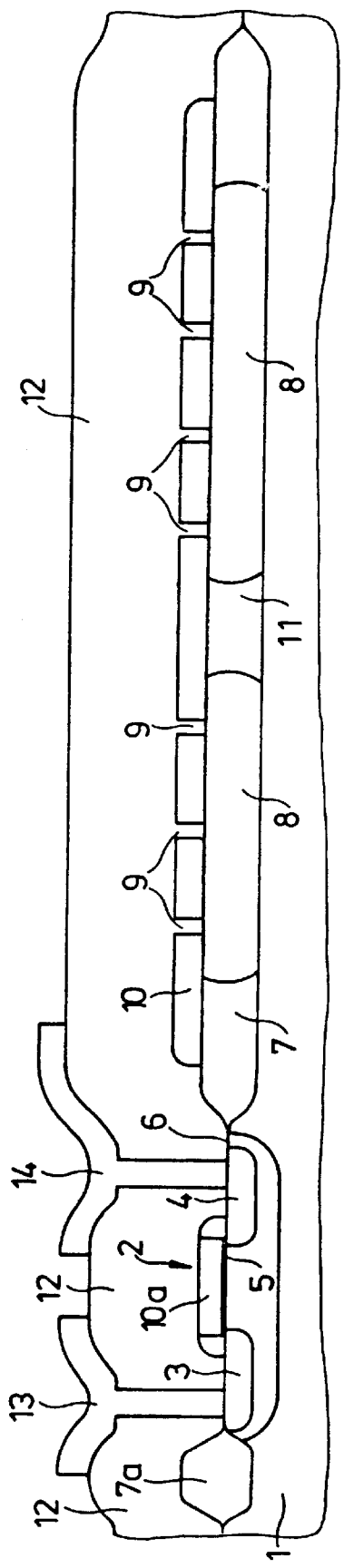
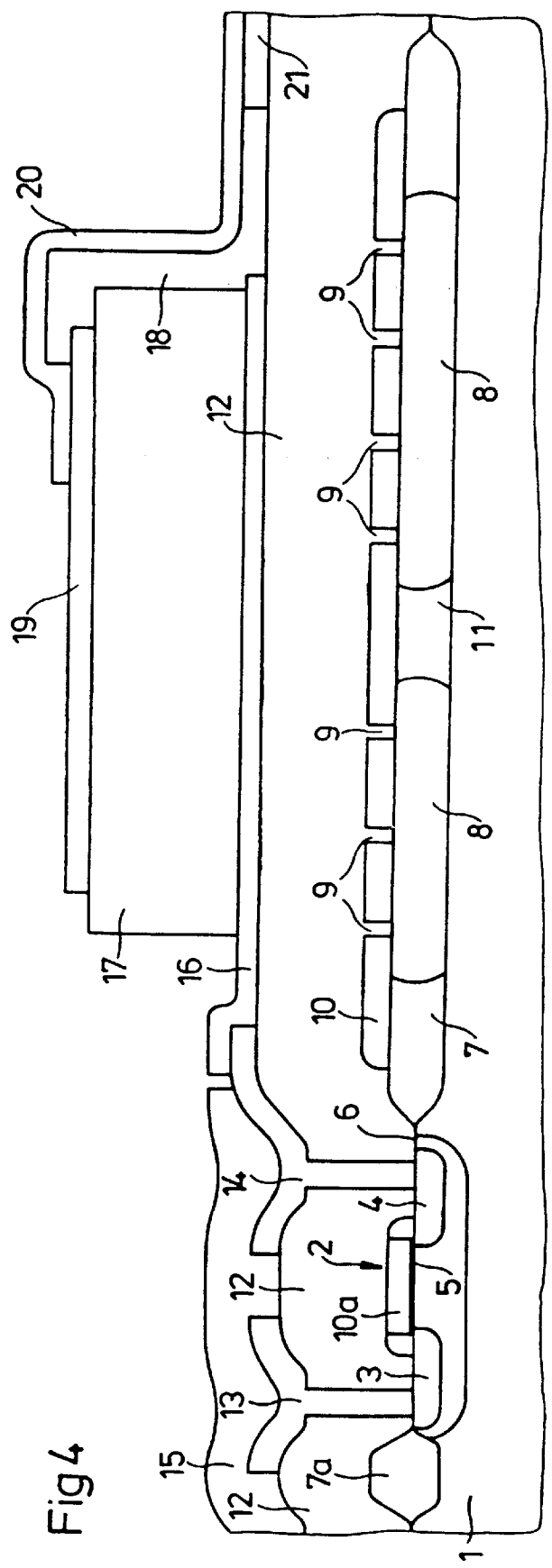

SEMICONDUCTOR DETECTOR FOR INFRARED RADIATION AND METHOD FOR MANUFACTURING SAME

BACKGROUND OF THE INVENTION

1. Field of the Invention

The present invention relates to a semiconductor detector for infrared radiation as well as to a method for manufacturing a semiconductor detector for infrared radiation.

2. Description of the Prior Art

A semiconductor detector for infrared radiation and a method for manufacturing such a detector are known, for example, from U.S. Pat. No. 3,801,949, in which a number of thermal (pyroelectric) detector elements are fashioned in a semiconductor substrate, each element being respectively electrically coupled with a semiconductor circuit that is likewise manufactured in the substrate. For the mechanical support of the detector elements, a layer of electrically insulating material is deposited via openings in the semiconductor substrate, the layer being sufficiently thin so as to provide a thermal resistance that is as high as possible in the direction of the heat flow along the plane of the insulating layer, but sufficiently thick to ensure self-supporting mechanical stability over the comparatively large-surface openings in the semiconductor substrate. A disadvantage of this approach is that the crystalline silicon semiconductor material, that is required for full integration in the manufacture of the read-out circuit structures, is completely etched away underneath the pyroelectrically active elements. Due to the insufficient mechanical stability of the insulating layer that serves for the support of the detector elements, this known method is at best suited (in particular given a larger number of active elements and correspondingly large-surface construction of the opening to be covered) for laboratory samples or semiconductor detectors for infrared radiation constructed for development purposes, but is not suited for a production that can be used in large piece numbers, with a yield at a level which is generally considered as sufficient.

SUMMARY OF THE INVENTION

An object of the present invention is to provide a spatially resolving, high-sensitivity semiconductor detector for infrared radiation, and to provide a method for manufacturing such a semiconductor detector for infrared radiation, which allow production in mass piece counts while ensuring the yield and reliability, and at the same time enabling integration into existing semiconductor process steps, in particular CMOS process steps.

The above object is achieved in accordance with the invention in a semiconductor detector for infrared radiation having a covering deposited on a carrier or substrate, in particular on a monocrystalline semiconductor substrate made of silicon, so as to construct at least one completely sealed hollow space between the covering and the carrier, with supporting elements within the hollow space to provide the necessary mechanical stability for supporting the infrared-sensitive detector elements on the covering. The infrared-radiation-sensitive material forming the individual detector elements, with the sensitive material extending on the covering only within a region limited by the completely sealed hollow space therebelow. According to the principle of the invention, the completely sealed hollow space is evacuated, so that a high thermal resistance is produced in the direction toward the incoming heat radiation, and the sensitivity of the spatially resolving detector to the infrared radiation to be measured is thereby improved. A sufficient mechanical stability is also achieved in high-resolution detector with a surface area of the material sensitive to infrared radiation of about 50×50 $\mu m^2$ or more, and with a number of active detector elements of more than 100×100 elements. At the same time, the invention enables the technological integration of the manufacturing steps for the detector into existing semiconductor processing lines for manufacturing the microcircuits required to control the detector elements, which microcircuits being produced, in particular, in conventional CMOS technology. The manufacturing of the detector elements with the material sensitive to infrared radiation, and the electrical coupling of the detector elements to the microcircuits, can advantageously ensue only after the microcircuits have been fully manufactured, so that existing and proven technological processes for the production of the microcircuits do not have to be fundamentally altered. In particular, it is not necessary to remove silicon material of the semiconductor substrate underneath the pyroelectrically active detector elements.

The above object is also achieved in a method according to the invention for the construction of the detector elements for infrared radiation, that are to be coupled electrically with the microcircuits, which is carried out after the complete manufacture of the microcircuits produced in the carrier by means of standard semiconductor technologies, and which includes the following steps. First, an auxiliary layer is deposited on the main surface of the carrier, this layer preferably being formed of an oxide material, and this layer being in a preferred embodiment, in the form of a field oxide layer that is present anyway. A membrane layer provided with at least one opening is deposited on the auxiliary layer, this membrane layer preferably being formed of silicon nitride, polysilicon, or a similar material. Subsequently, the auxiliary layer is selectively etched through the aforementioned at least one opening of the membrane layer, preferably by means of a wet-chemical etching process with isotropic components, so that a hollow space results in the auxiliary layer. By means of suitable construction and number of the openings in the membrane layer and/or adjustment of the etching process, at least a part of the material of the auxiliary layer can be left standing for the fashioning of one or more supports for the membrane layer and/or for the covering, in order to ensure a sufficient mechanical stability of the detector elements, in particular given larger-surface detector elements.

In particular given high-resolution infrared detectors with a large number of active detector elements, it can be advantageous in the context of the invention, for increasing the sensitivity of the detector, to provide a multilayer construction of the auxiliary layer or of the membrane layer, in order to form several connected hollow spaces arranged so as to lie one over the other. This increases the thermal insulation of the detector elements from the base substrate, such insulation being important for the sensitivity. Such a multilayered construction of the hollow space layers ensures a sufficient thermal insulation, and at the same time sufficient mechanical stability, of the detector elements.

The hollow space layers (arranged in multilayer fashion if warranted) are, after their formation as described above, completely sealed by depositing a covering on the uppermost membrane layer, which preferably ensues by depositing a suitable material using a CVD (chemical vapor deposition) method. The deposition of the material for the covering preferably ensues in a vacuum apparatus, so that in this manufacturing step the hollow space, sealed on all sides, is simultaneously evacuated.

Subsequently, a lower electrode is deposited on the covering, preferably in the form of a thin layer of platinum. The material of the detector element sensitive to infrared radiation is then deposited on the lower electrode within a section of the covering limited by (i.e., within the boundaries of) the sealed hollow space therebelow. After then attaching an insulator laterally to the sensitive material, an upper electrode is applied and structured, preferably in the form of a thin CrNi layer. A particular advantage of this arrangement is that the detector elements are completely embedded between metal electrodes.

For the sealing of the hollow space, the material of the covering, deposited with a predetermined thickness, can advantageously be subjected to a temperature step, i.e. a flowing process or a hardening process. The flowing ensues in a vacuum apparatus, because the holes are not yet sealed by the deposited layer. After this step, the hollow space is sealed with a covering of uniform layer thickness. As the material of the covering, a doped glass (e.g., a borophosphate silicate glass, called BPSG) is preferably deposited in a CVD method as a covering layer, and is caused to flow at a temperature of about 800 to 1100° C. Silicon dioxide doped with boron and/or phosphorus can thus be used as the glass, as is used in standard CMOS processes for the planarization of the surface. The boron content or phosphorus content typically lies between 1% and 6%. In addition, a polyimide, as is used for the passivation of chips, can be used as the material of the covering. As is also standard in passivation, this material is spun on, and is hardened at e.g. 300° C.

By appropriate arrangement of the openings in the membrane layer, any desired shape and surface of the hollow space or of the covering, can be produced easily. In order to produce narrow channels as the hollow space, a correspondingly long window in the membrane layer can be used instead of a row of holes, so that the side walls of the channels are constructed parallel to the channel direction.

The hollow spaces or coverings that can be produced with the inventive method are very stable, and withstand even the pressure forces of up to 80 bar that occur during assembly in the plastic housing. At the same time, the manufacturing ensues with a method that is completely compatible with semiconductor technologies, so that microsystems can be manufactured unproblemmatically.

DESCRIPTION OF THE DRAWINGS

FIGS. 1 to 4 respective show schematic cross-sections through a semiconductor substrate in the region of a detector element, as occur in the successive steps of the method.

DESCRIPTION OF THE PREFERRED EMBODIMENTS

Figure 5:
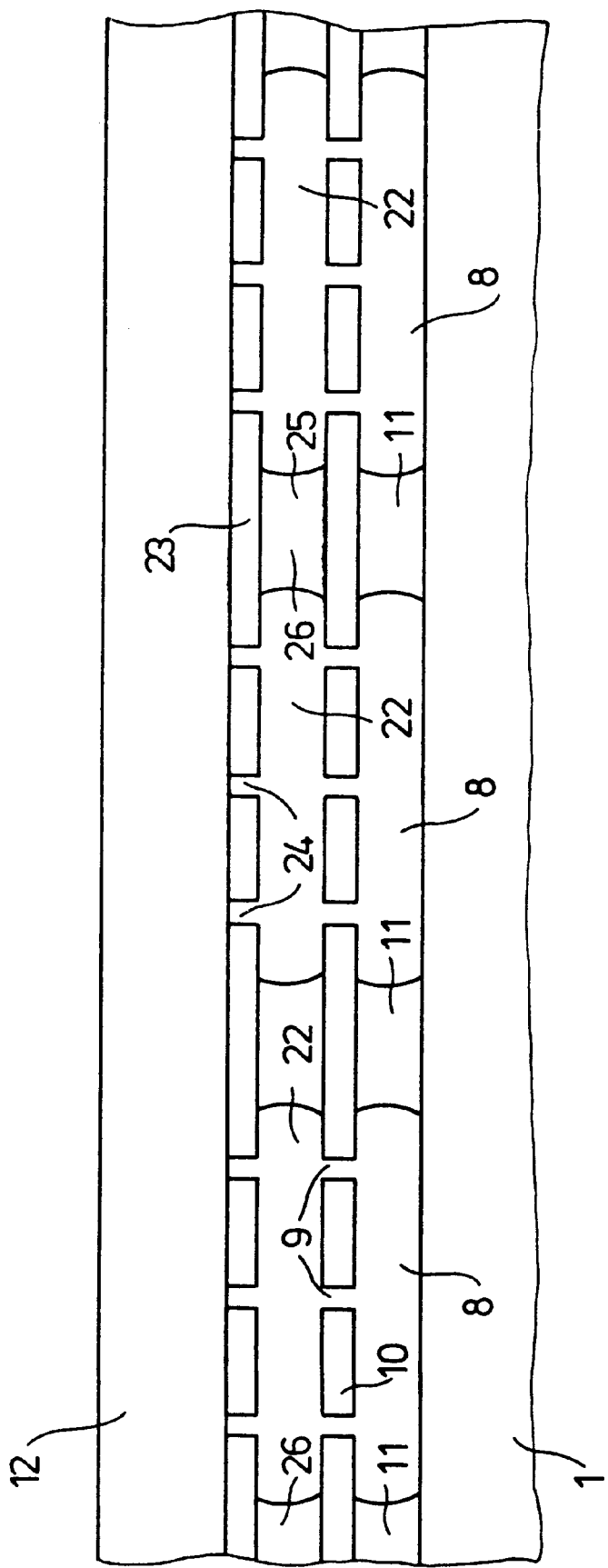
FIG. 5 shows a schematic sectional view of a second exemplary embodiment of the invention.

FIG. 1 shows a first exemplary embodiment of a partially completed semiconductor detector for infrared radiation, after the manufacture of the microcircuits in standard CMOS technology in a carrier or substrate 1. These microcircuits include an MOS transistor 2 (shown as an example) with a source region 3, a drain region 4, and a gate region 5. Field oxide layers 7 or and 7a are arranged on the main surface 6 of the carrier 1, the region 7 serving as an auxiliary layer for the fashioning of a hollow space 8. For this purpose, a structured membrane layer 10 of polysilicon, provided with openings 9, is arranged over the oxide layer 7, with a thickness of, for example, about 0.2 μm. Preferably, the material of the membrane layer 10 is deposited at the same time as the fashioning of the gate electrode region 10a, which likewise is formed of polysilicon. By means of a wet-chemical etching using hydrofluoric acid, the auxiliary layer 7 is selectively etched so that one or more hollow spaces 8 result, with the arrangement, number and dimensioning of the hollow spaces 8 being adjusted by the size, number and arrangement of the openings 9. A part of the material of the auxiliary layer 7 is left standing so as to form a support 11 for the membrane layer 10.

As shown in FIG. 2, a flowable material in the form of BPSG 12 is subsequently deposited, and is melted on in the vacuum at a temperature of for example 900° C. In this step, at the same time the hollow space 8 is evacuated and sealed.

A metallization step follows in which, as shown in FIG. 3, metal paths 13 and 14, for example of aluminum, are arranged for the electrical connection of the transistor electrodes 3 and 4. This step can be followed by further manufacturing steps for the construction of additional metallization planes or wiring planes, these further steps not being shown for clarity. Subsequently, a passivation layer 15, preferably of a nitride, can be provided in a known way, this layer being indicated only schematically according to FIG. 4.

For the manufacture of a detector element sensitive to IR radiation, a platinum layer 16 is deposited (if warranted, after exposure of the manufactured surface structure of the component), and is structured so that an electrical coupling with the metallization path 14, and thus an electrical connection to the drain region 4 of the transistor 2, is produced. The IR-sensitive material 17 is deposited and structured on the lower electrode 16 by means of a thin layer method, preferably sputtering or a CVD or sol-gel method, so that the material 17 sensitive to infrared radiation is arranged inside a region of the covering 10 and BPSG 12 that is limited by (with the boundaries of) the hollow space 8. For the IR-sensitive material 17, ferroelectric dielectric materials with comparatively high Curie temperatures of from more than 250° to 300° C., preferably more than 450° C., have proven advantageous, in particular for spatially high-resolution IR detectors according to the invention. Ferroelectric perovskites such as, for example, lead zirconate titanate ($PbTiZrO_3$) or lead titanate ($PbTiO_3$) and compounds thereof are thus preferred. The IR-sensitive material 17 is structured for the construction of individual basic cells. Subsequently, the lower electrode 16 is structured, an upper electrode 19 is deposited on the active surface of the IR-sensitive material 17 in the form of a 20 nm-thick CrNi layer, and an insulator 18 is laterally attached to the IR-sensitive material 17. An electrode reinforcement 20 (e.g., a 450 nm-thick gold layer) is deposited over this insulator 18, and is connected with a metallic row conductor 21, to which in turn the gate electrodes 10a of the transistors 2 of a control circuit are electrically connected. The semiconductor detector is thus formed of a large number of detector elements that can be controlled row-by-row and column-by-column. For a high-resolution semiconductor detector for infrared radiation, the surface of the IR-sensitive material 17 of an element is about 50×50 $\mu m^2$, and the number of active elements is typically more than 100×100 elements. In a detector for infrared radiation with low resolution, in some circumstances a smaller number of active elements, e.g. 10×10 or 20×20 detector elements (pixels), is sufficient.

FIG. 5 shows, in a schematic side sectional view, a second exemplary embodiment of an inventive semiconductor detector, in which at least two communicating hollow spaces 8 and 22 are fashioned which are disposed over one another, instead of only one hollow space 8. This embodiment has the advantage of improved sensitivity of the detector elements, because the thermal insulation is improved due to the greater thickness of the vacuum region between the sensitive material 17 and the substrate 1, but the mechanical stability of the multilayer arrangement is still ensured. Of course, it is possible to manufacture not just two hollow space layers over one another but arbitrarily many, as long as sufficient mechanical stability is retained. For the manufacture of the second layer with the hollow space 22, a further membrane layer 23 made of polysilicon with a thickness of about 0.2 μm is provided, which has openings 24 by means of which the auxiliary layer 25 lying thereunder is wet-chemically etched for the manufacture of the hollow space 22. A part of the material of the auxiliary layer 25 is left standing for the formation of a support 26 for the further membrane layer 23. The hollow spaces 8 and 22 are evacuated. The protective layer 12 is subsequently deposited on the membrane layer 23. All remaining components and manufacturing steps in the embodiment according to FIG. 5 follow those of the first exemplary embodiment, so that reference may be made to the more detailed explanations given above.

Although various minor modifications might be suggested by those skilled in the art, it should be understood that we wish to embody within the scope of the patent warranted hereon all such modifications as reasonably and properly come with the scope of our contribution to the art.

We claim as my invention:

1. A method for manufacturing a semiconductor detector for infrared radiation, comprising the steps of:

depositing an auxiliary layer on a primary surface of a carrier;

depositing a membrane layer, with at least one opening therein, onto said auxiliary layer;

selectively etching said auxiliary layer through said at least one opening in said membrane layer for producing a hollow space in said auxiliary layer;

sealing said hollow space by depositing a covering over said membrane layer; and depositing infrared radiation-sensitive material on said covering within a region of said covering limited by the hollow space therebelow.

2. A method as claimed in claim 1 comprising the additional step of evacuating said hollow space while depositing said covering.

3. A method as claimed in claim 1 wherein the step of selectively etching said auxiliary layer comprises selectively etching said auxiliary layer with isotropic components and leaving a portion of the material of said auxiliary layer standing inside hollow space for forming a support for said membrane layer and said covering.

4. A method as claimed in claim 1 comprising the additional steps of:

providing a semiconductor substrate as said carrier;

forming a semiconductor circuit on said primary surface of said semiconductor substrate outside of said region limited by said hollow space; and electrically coupling said semiconductor circuit to said infrared radiation-sensitive material.

5. A method as claimed in claim 1 comprising the additional steps of:

depositing a lower electrode on said covering before depositing said infrared radiation-sensitive material; and depositing and structuring an upper electrode on said infrared radiation-sensitive material after depositing said infrared radiation-sensitive material.

6. A method as claimed in claim 5 comprising the additional step of:

laterally attaching an insulator to said infrared radiation-sensitive material for electrically insulating said lower electrode from said upper electrode.

7. A method as claimed in claim 1 comprising the additional step of employing a ferroelectric dielectric as said infrared radiation-sensitive material.

8. A method as claimed in claim 7 comprising the additional step of selecting said ferroelectric dielectric from the group consisting of lead, zirconate, titanate and lead titanate.

9. A method as claimed in claim 1 wherein the step of depositing said covering comprises depositing a thermally insulating material as said covering.

10. A method as claimed in claim 9 comprising the additional step of selecting said thermally insulating material from at least one material in the group consisting of polysilicon, nitrides, and glasses.

11. A method as claimed in claim 9 comprising the additional step of selecting said thermally insulating material from at least one material in the group consisting of polysilicon, nitrides, and phosphor glass.

12. A method as claimed in claim 1 wherein said auxiliary layer comprises a first auxiliary layer and wherein said membrane layer comprises a first membrane layer and wherein said at least one hollow space comprises at least one first hollow space, said method comprising the additional steps of:

depositing a further auxiliary layer over said first membrane layer;

depositing a further membrane layer over said further auxiliary layer, said further membrane layer having at least one opening therein;

selectively etching said further auxiliary layer through said at least one opening in said further membrane layer simultaneously with etching said first auxiliary layer, for producing at least one further hollow space in said further auxiliary layer simultaneously with said first hollow space in said auxiliary layer; and depositing said covering over said further membrane layer for sealing said first and second hollow spaces.

13. A semiconductor detector for infrared radiation, comprising:

a carrier and auxiliary layer deposited on a primary surface of said carrier;

a membrane layer, with at least one opening therein, deposited onto said auxiliary layer;

said auxiliary layer having at least one hollow space therein selectively etched through said at least one opening in said membrane layer;

a covering deposited over said membrane layer and sealing said hollow space; and infrared radiation-sensitive material deposited on said covering within a region of said covering limited by the hollow space therebelow.

14. A detector as claimed in claim 13 wherein said auxiliary layer comprises a portion of the material of said auxiliary layer left standing inside hollow space after selectively etching said auxiliary layer forming a support for said membrane layer and said covering.

15. A detector as claimed in claim 13 wherein said carrier is a semiconductor substrate, and said detector further comprising:

a semiconductor circuit on said primary surface of said semiconductor substrate outside of said region limited by said hollow space; and connections electrically coupling said semiconductor circuit to said infrared radiation-sensitive material.

16. A detector as claimed in claim 13 further comprising:

a lower electrode deposited on said covering before depositing said infrared radiation-sensitive material; and depositing and structuring an upper electrode on said infrared radiation-sensitive material after depositing said infrared radiation-sensitive material.

17. A detector as claimed in claim 16 comprising:

an insulator laterally attached to said infrared radiation-sensitive material for electrically insulating said lower electrode from said upper electrode.

18. A detector as claimed in claim 13 wherein said infrared radiation-sensitive material comprises a ferroelectric dielectric.

19. A detector as claimed in claim 18 wherein said ferroelectric dielectric is selected from the group consisting of lead, zirconate, titanate and lead titanate.

20. A detector as claimed in claim 13 wherein said covering comprises a thermally insulating material.

21. A detector as claimed in claim 20 wherein said thermally insulating material is selected from at least one material in the group consisting of polysilicon, nitrides, and glasses.

22. A detector as claimed in claim 20 wherein said thermally insulating material is selected from at least one material in the group consisting of polysilicon, nitrides, and phosphor glass.

23. A detector as claimed in claim 13 wherein said auxiliary layer comprises a first auxiliary layer and wherein said membrane layer comprises a first membrane layer and wherein said at least one hollow space comprises at least one first hollow space, said detector further comprising:

a further auxiliary layer deposited over said first membrane layer;

a further membrane layer deposited over said further auxiliary layer, said further membrane layer having at least one opening therein;

said further auxiliary layer having at least one further hollow space therein selectively etched through said at least one opening in said further membrane layer simultaneously with etching said first auxiliary layer; and said covering being deposited over said further membrane layer and sealing both said first and second hollow spaces.

* * * * *